US005461009A

United States Patent [19]

Huang et al.

[11] Patent Number: 5,461,009

[45] Date of Patent: Oct. 24, 1995

[54] METHOD OF FABRICATING HIGH UNIFORMITY FIELD EMISSION DISPLAY

[75] Inventors: Jammy C. Huang, Taipei; Chun-Hui Tsai, Hsin Chu, both of Taiwan

[73] Assignee: Industrial Technology Research Institute, Hsinchu, Taiwan

[21] Appl. No.: 162,954

[22] Filed: Dec. 8, 1993

[51] Int. Cl.[6] .......... H01L 21/465

[52] U.S. Cl. .......... 437/228; 437/927; 156/643.1; 156/644.1; 445/24; 445/49; 445/50; 315/334; 315/337; 313/309; 313/336; 313/351

[58] Field of Search .......... 437/228, 89, 927; 445/24, 49, 50; 315/334, 337; 313/309, 336, 351; 156/643.1, 644.1

[56] References Cited

U.S. PATENT DOCUMENTS

| | | | |
|---|---|---|---|
| 4,721,885 | 1/1988 | Brodie | 313/576 |
| 4,857,161 | 8/1989 | Borel et al. | 204/192.26 |
| 4,940,916 | 7/1990 | Borel et al. | 313/306 |
| 5,007,873 | 4/1991 | Goronkin et al. | 445/49 |
| 5,055,077 | 10/1991 | Kane | 313/336 |
| 5,090,932 | 2/1992 | Dieumegard et al. | 437/89 |
| 5,151,061 | 9/1992 | Sandhu | 445/24 |
| 5,173,634 | 12/1992 | Kane | 313/306 |
| 5,186,670 | 2/1993 | Doan et al. | 445/24 |
| 5,188,977 | 2/1993 | Stengl et al. | 445/49 |
| 5,189,341 | 2/1993 | Itoh et al. | 315/169.1 |
| 5,229,331 | 7/1993 | Doan et al. | 437/228 |
| 5,235,244 | 8/1993 | Spindt | 313/495 |
| 5,278,472 | 1/1994 | Smith et al. | 313/351 |
| 5,319,279 | 6/1994 | Watanabe et al. | 313/351 |
| 5,391,259 | 2/1995 | Cathey et al. | 156/643.1 |
| 5,394,006 | 2/1995 | Liu | 313/336 |
| 5,420,054 | 5/1995 | Choi et al. | 437/228 |

FOREIGN PATENT DOCUMENTS

| | | | |
|---|---|---|---|
| 5021002 | 1/1993 | Japan | 445/51 |

OTHER PUBLICATIONS

"Field–Emitter . . . Microelectronics", Spindt et al., IEEE Transactions on Electron Devices, vol. 38, No. 10, Oct. 1991.

*Primary Examiner*—Olik Chaudhuri
*Assistant Examiner*—Long Pham
*Attorney, Agent, or Firm*—George O. Saile; Stephen B. Ackerman

[57] ABSTRACT

A microtip structure with high uniformity, low operating voltage and no resistive dissipation for a field emission display is described. A substrate is provided. A first conductive layer is formed on the substrate that acts as a cathode. A second conductive layer with a narrow circular opening acts as a gate. A first dielectric layer separates the cathode and the gate. The microtip extends up from the cathode and into the opening. A second dielectric layer is over the gate, with a circular opening that is larger than and concentric with the narrow circular opening in the gate. A means to provide a brief, charging voltage to the gate, followed by a longer operational voltage, wherein the amplitude of the operational voltage is lower than the amplitude of the charging voltage, is included.

11 Claims, 7 Drawing Sheets

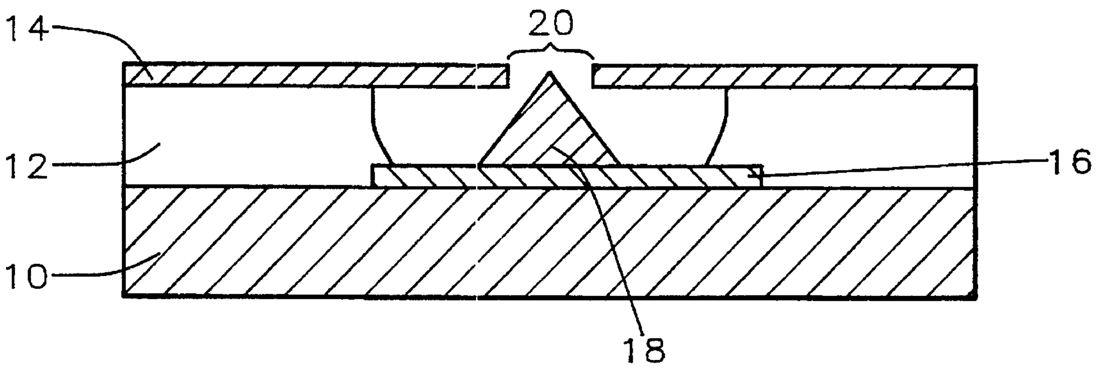
FIG. 1 - Prior Art
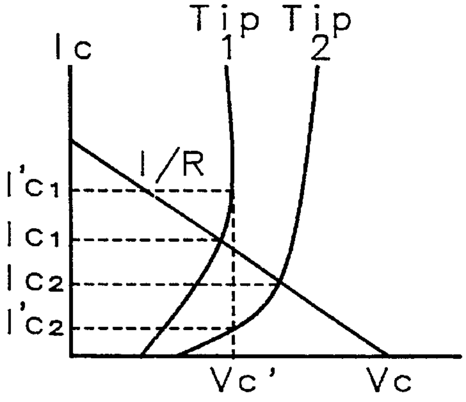
FIG. 2 - Prior Art
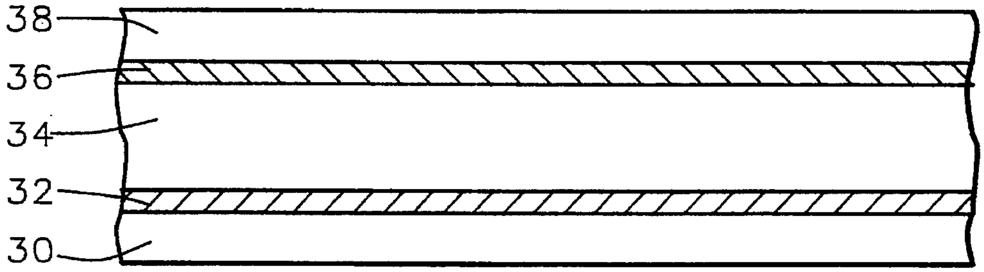
FIG. 3

METHOD OF FABRICATING HIGH UNIFORMITY FIELD EMISSION DISPLAY

BACKGROUND OF THE INVENTION

1. Field of the Invention

The invention relates to field emission flat panel displays, and more particularly to methods for making field emission microtips with high uniformity for a high resolution matrix addressed flat panel display, and the resulting field emission microtips.

2. Description of the Related Art

In the area of computer displays, there is an increasing trend toward flat, thin, lightweight displays to replace the traditional cathode ray tube (CRT) device. One of several technologies that provide this capability is field emission displays (FED). An array of very small, conical emitters is manufactured, typically on a semiconductor substrate, and can be addressed via a matrix of columns and lines. These emitters are connected to a cathode, and surrounded by a gate. When the proper voltages are applied to the cathode and gate, electrons are emitted and attracted to the anode, on which there is catholuminescent material that emits light when excited by the emitted electrons, thus providing the display element. The anode is typically mounted in close proximity to the cathode/gate/emitter structure and the area in between is typically a vacuum.

U.S. Pat. Nos. 4,857,161 and 4,940,916, both to Borel et al, show basic methods for making field emission displays. In the latter patent, a resistive layer is added which covers the cathode layer and is under the microtips. The purpose is to prevent cathode destruction and improve thermal dissipation. This prior art structure is shown in FIG. 1, in which is shown cathode 10, dielectric layer 12, gate 14, the added resistive layer 16, and emitter 18.

The radius of the tip of emitter 18, and the size of gate opening 20, as shown in FIG. 1, are two of the critical parameters that can vary from one microtip to another. This variation leads to different characteristic operating curves among emitter tips. FIG. 2 illustrates the operating curves for two tips, Tip 1 and Tip 2. With no resistive layer 16, for a given operating voltage $V_c'$, there will be a large difference in emission current between tips, since Tips 1 and 2 will operate at current levels $I_{c1}'$ and $I_{c2}'$, respectively. This difference causes non-uniformity of field emission device operation.

The added resistive layer 16 acts as a resistive load, as shown in FIG. 2 by the line 1/R. At operating voltage $V_c$, there will be a much smaller difference in emission current between tips, which in FIG. 2 is indicated by emission current $I_{c1}$ and $I_{c2}$ for Tip 1 and Tip 2, respectively. The resistive layer of the related art also drops all voltage applied between gate and cathode in the event of a short circuit between gate 14 and emitter 18, and would isolate the short circuit point.

However, the addition of the resistive layer results in a higher operating voltage, in order to supply the voltage drop, typically 10 volts, across the resistive layer. The added resistive layer has a further disadvantage in that there is added power dissipation from the resistor. From the estimation of U.S. Pat. No. 4,940,916, the power dissipation from the resistive layer is between 1 and 10 microwatts per emitter. If a large area FED is operated in which there are millions of emitters, the power dissipation will be unacceptably high.

Some prior art patents show a dielectric layer that is added on top of the gate layer. These are for different purposes and are formed differently than will be described for the invention below. In U.S. Pat. No. 5,151,061, Sandhu shows a second dielectric, but apparently this is only used as a process layer, and is not used in the final structure. In both U.S. Pat. Nos. 5,173,634 and 5,189,341, the dielectric layer is used to separate the two electrodes of dual-gate structures. Doan et al in U.S. Pat. No. 5,186,670 describe a focus ring 19 that is separated from the gate 15 by a dielectric. However, this focus ring would likely not be used over a large area in which many FE devices would be used. In U.S. Pat. No. 5,188,977, the dielectric layer 4 is used to separate the gate 3 from an attached substrate 9.

SUMMARY OF THE INVENTION

It is therefore an object of this invention is to provide a high resolution matrix addressed flat panel display having microtips with high uniformity, low operating voltage and no resistive dissipation.

Another object of this invention is to provide a very manufacturable method of fabricating a high resolution matrix addressed flat panel display having microtips with high uniformity, low operating voltage and no resistive dissipation.

These objects are achieved by a microtip structure for a field emission display. A substrate is provided. A first conductive layer is formed on the substrate that acts as a cathode. A second conductive layer with a narrow circular opening acts as a gate. A first dielectric layer separates the cathode and the gate. The microtip extends up from the cathode and into the opening. A second dielectric layer is over the gate, with a circular opening that is larger than and concentric with the narrow circular opening in the gate. A means to provide a brief, charging voltage to the gate, followed by a longer operational voltage, wherein the amplitude of the operational voltage is lower than the amplitude of the charging voltage, is included.

These objects are further achieved by a method of fabricating field emission microtips on a substrate. A first conductive layer is formed on the substrate to act as a cathode. A first dielectric layer is formed over the first conductive layer. A second conductive layer is formed over the first dielectric layer to act as a gate. A second dielectric layer is formed over the second conductive layer. The second dielectric layer is patterned to provide an opening to the second conductive layer. A thin insulating layer is formed over the second dielectric layer and the second conductive layer. The thin insulating layer and the second conductive layer are patterned to form a narrower opening than the opening in the second dielectric layer. The first dielectric layer is removed in the region defined by the narrower opening, and also a portion of the first dielectric layer under the second conductive layer and adjacent to the narrower opening. Microtips are formed on the exposed surface of the first conductive layer.

BRIEF DESCRIPTION OF THE DRAWINGS

FIG. 1 is a cross-sectional representation of a prior art field emission microtip structure.

FIG. 2 is a graphical depiction of the operating characteristics of a prior art microtip.

FIGS. 3 to 9 are a cross-sectional representation for one method of the invention for forming field emission microtips with high uniformity.

DESCRIPTION OF THE PREFERRED EMBODIMENTS

Figure 4:
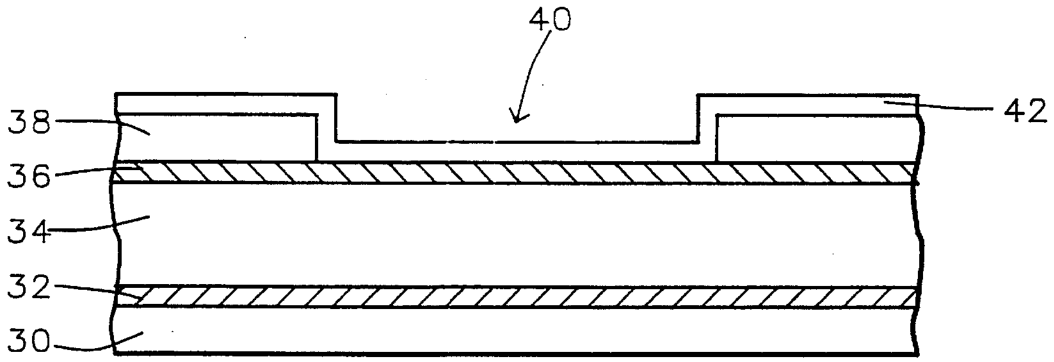

Referring now to FIG. 3, a dielectric base 30 is provided. This may consist of a substrate of, typically, glass, silicon wafer, or the like. Depending upon the type of substrate used it may be preferred to use a dielectric layer (not shown) over the surface of the substrate 30. Such a layer may be for example, aluminum oxide ($Al_2O_3$) or silicon dioxide ($SiO_2$) which would be deposited or thermally grown (in the case of $SiO_2$) by conventional integrated circuit processes and having a thickness of between about 5,000 to 20,000 Angstroms. Usually this layer is used to obtain good adhesion for subsequent layers. When a silicon substrate is used for substrate 30, a thermally grown oxide is preferred for the dielectric layer. If a glass substrate 30 is used, then a deposited $SiO_2$ or $Al_2O_3$ is preferred. A conductive layer 32 composed of molybdenum, aluminum, tungsten, etc, or doped polysilicon is deposited by sputtering, electron beam evaporation or chemical vapor deposition (CVD) and has a thickness of between about 2000 and 5000 Angstroms. The layer 32 is patterned by conventional lithography and etching techniques into parallel, spaced conductors acting as cathode columns for the display being formed upon the substrate 30.

A first dielectric 34 is formed which is preferably silicon oxide ($SiO_2$), but could alternatively be aluminum oxide ($Al_2O_3$). This layer 34 is deposited by sputtering, e-beam evaporation, or CVD, and has a thickness of between about 10,000 and 15,000 Angstroms. Conductive layer 36 is now deposited using molybdenum, tungsten, aluminum or other similar metals, or polycrystalline silicon, typically deposited by sputtering or Low Pressure Chemical Vapor Deposition (LPCVD), to a thickness of between about 2000 and 5000 Angstroms. Layer 36 forms the gate lines for the display.

In a critical step of the invention, dielectric layer 38 is formed on gate layer 36. This dielectric is deposited in a similar way and is of similar material as first dielectric layer 34. It is deposited to a thickness of between about 5000 and 10,000 Angstroms. Referring now to FIG. 4, a circular opening 40 is made in dielectric 38. This opening is formed by conventional lithography and etching and has a diameter of between about 2 and 4 micrometers. A thin layer 42 of silicon nitride ($Si_3N_4$) or, alternately, silicon dioxide ($SiO_2$) is deposited conformally on layer 38 and within the circular opening 40. This is accomplished by LPCVD and is to a thickness of between about 1000 and 2000 Angstroms.

Figure 5:
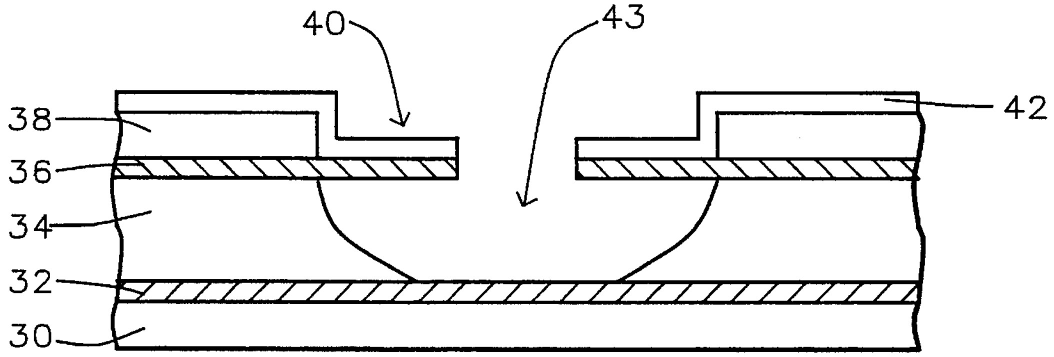

Referring now to FIG. 5, a narrower circular opening 43 is formed in layer 42 and in gate layer 36. This narrower opening 43 is formed by conventional lithography and a dry etch, for example, a reactive ion etch, for the two layers 42 and 36. Opening 43 has a diameter of between about 0.8 and 1.2 micrometers. Layer 34 is etched using a conventional wet etch, as is known in the art.

Figure 6:
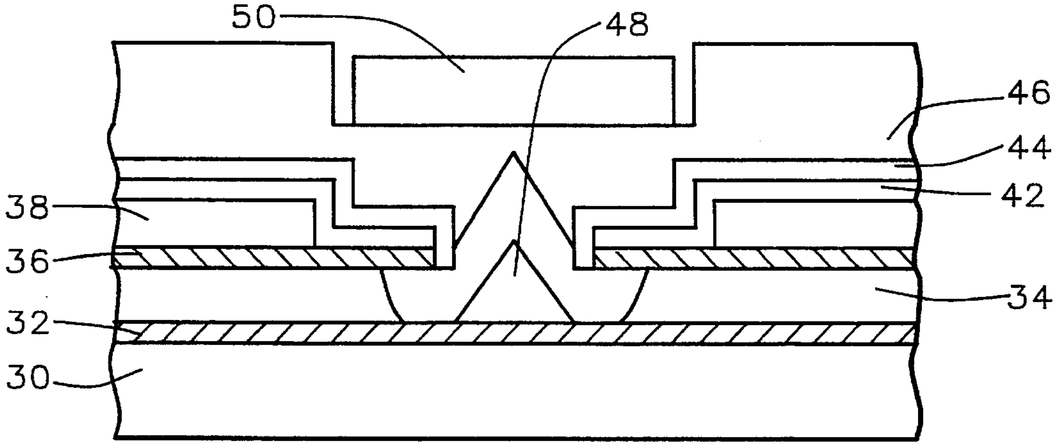

With reference to FIG. 6, microemitter 48 is formed. A sacrificial layer 44 of, for instance, nickel, is deposited by e-beam evaporation using graze angle deposition (to prevent filling of opening 43) by tilting the wafer at an angle of 75°. The thickness of this layer is about 1500 Angstroms. In FIG. 6, a layer of molybdenum 46 is deposited vertically to a thickness of about 18,000 Angstroms, thus forming field emission microtip 48 which is connected to cathode conductor 32 and has a height of between about 12,000 and 15,000 Angstroms. Tip protection layer 50 is then deposited and patterned by conventional means over each microtip.

Figure 7:
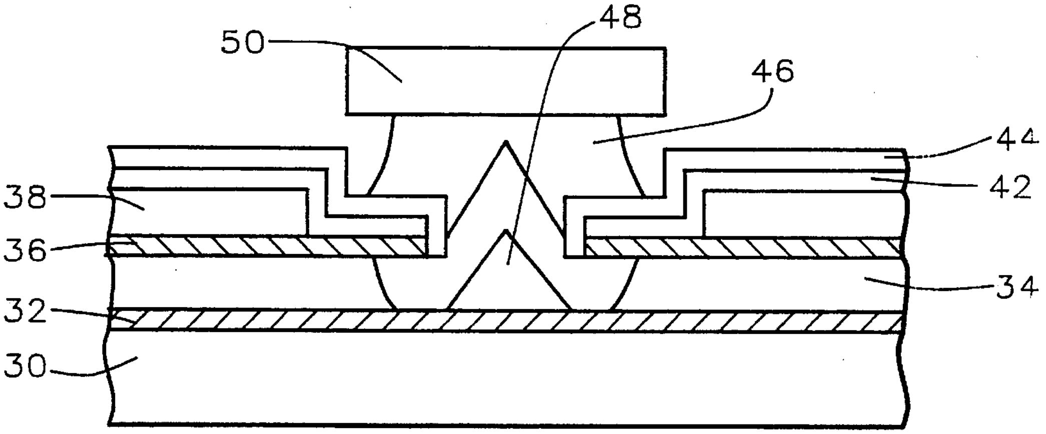
Figure 8:
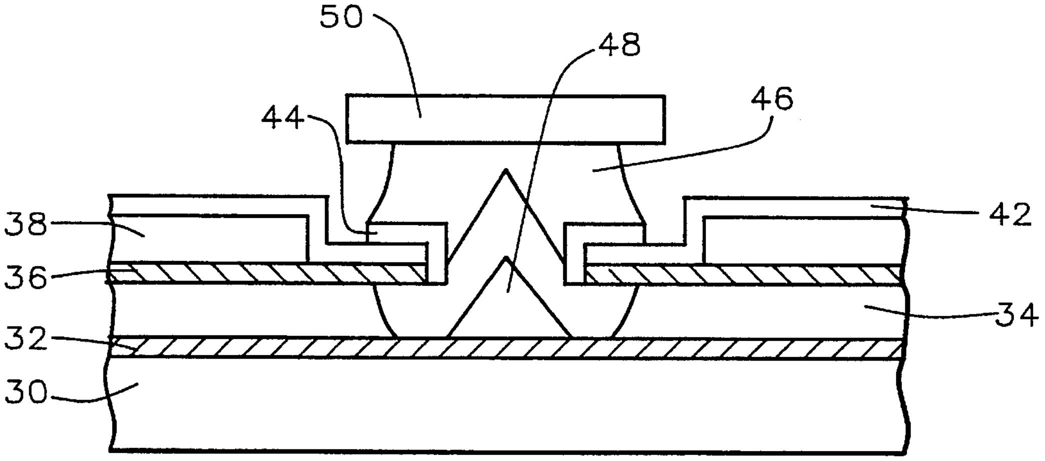

Referring now to FIG. 7, layer 46 is removed in all areas not protected by layer 50 by a dry etch, using layer 44 as an etch stop. Layer 44 also is removed, by reactive ion etching, except in those areas masked by tip protection layer 50, as shown in FIG. 8. Protection layer 50 is removed. The last step needed to expose the microtips is removal of the remainder of layers over the microtips, layers 44 and 46, to form the structure shown in FIG. 9.

Figure 9:
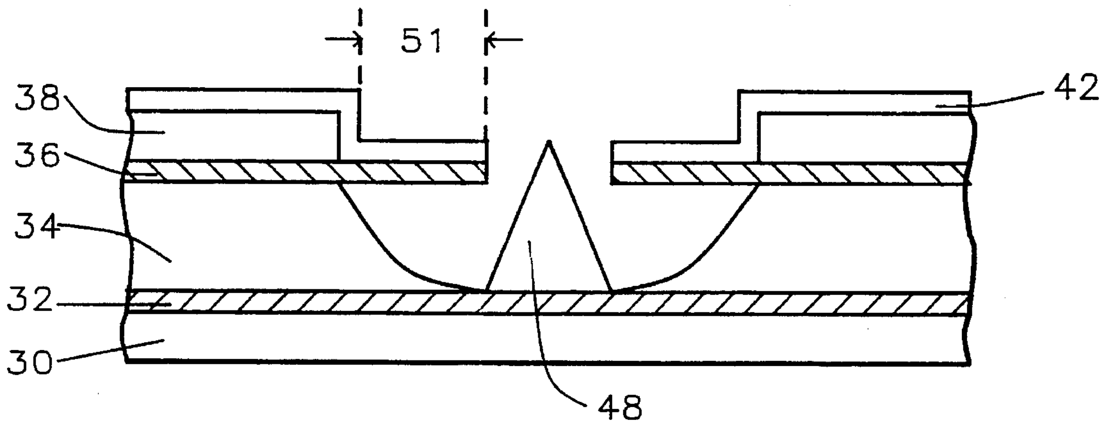
Figure 10:
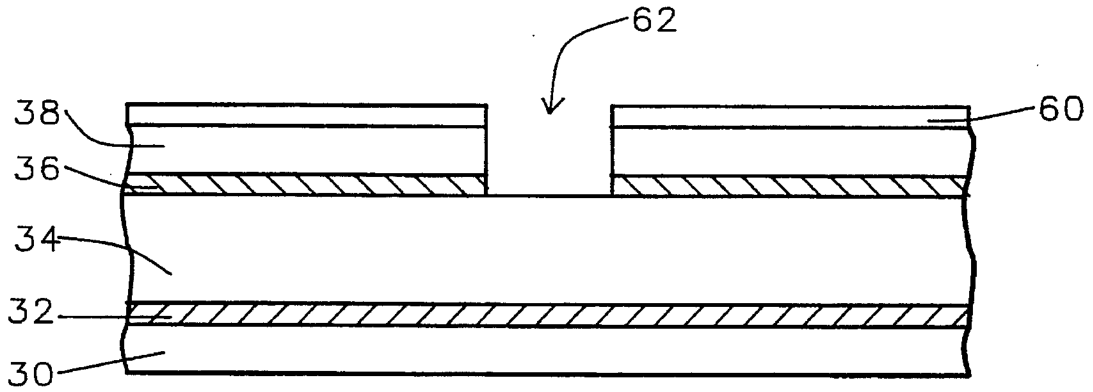
FIGS. 10 to 12 are a cross-sectional representation for a second method of the invention for forming field emission microtips with high uniformity.

A second method may be used to form the FIG. 9 structure. Starting from FIG. 3, a top masking layer 60 is deposited, as shown in FIG. 10. This layer may be a photoresist or silicon nitride ($Si_3N_4$) in which opening 62 is formed by conventional lithography and dry etching layers 60, 38 and 36. This opening would have the same dimensions as opening 43 in FIG. 5, that is, a diameter of between about 0.8 and 1.2 micrometers.

Figure 11:
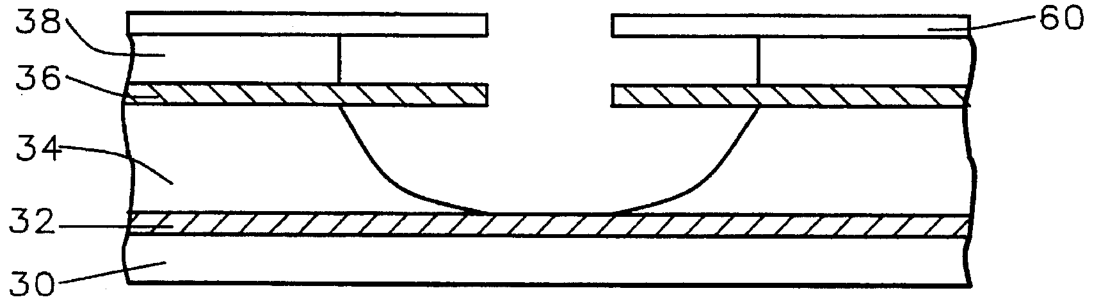

A wet etch is used to etch layers 34 and 38 to result in the FIG. 11 structure. The etchant used depends on the material used for the two layers. For example, if the two layer 34 and 38 are formed of silicon dioxide ($SiO_2$), a buffered hydrofluoric acid (HF) etch would be used. Emitter tip 70 is formed in the same way as the first method. Layer 60 is removed, and the final structure is shown in FIG. 12.

Figure 12:
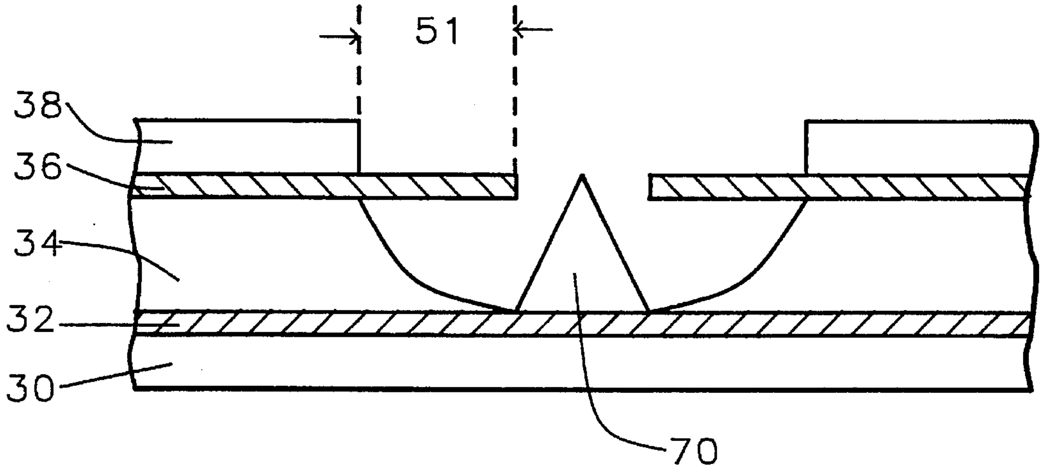

A critical dimension of the invention is the offset 51 of the second dielectric layer 38, as shown for the two methods in FIGS. 9 and 12. This distance is between about 0.5 and 1.5 micrometers.

Figure 13:
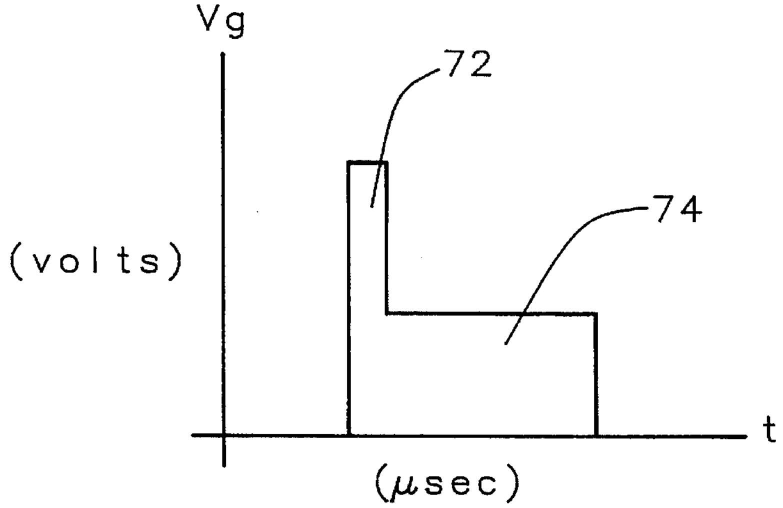
FIG. 13 is a graphical depiction of a voltage pattern that is applied to the gate of the field emission display of the invention to create high uniformity.

The operational aspects of the invention are now described. To overcome the problem of non-uniformity among the emitter tip radii and the gate opening among adjacent microemitters, a voltage cycle as shown graphically in FIG. 13 is applied to the gate. A brief, charging voltage 72 is applied for a period of between about 0.8 and 1.2 microseconds, and has an amplitude of between about 80 and 90 volts. A longer, operational voltage 74 is then applied, wherein the amplitude of the operational voltage is lower than the amplitude of the charging voltage and is between about 40 and 50 volts, with a duration of between about 28 and 42 microseconds.

Figure 14:
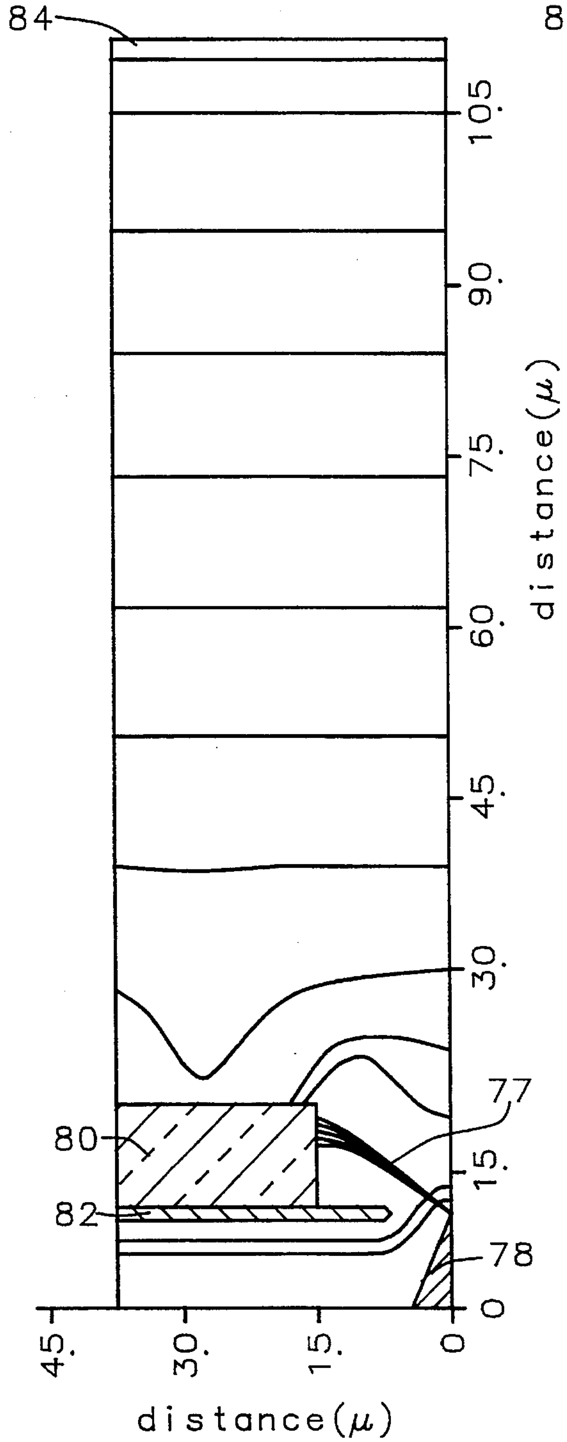
FIGS. 14 and 15 are depictions of the field emission device of the invention and its effect on electron flow.
Figure 15:
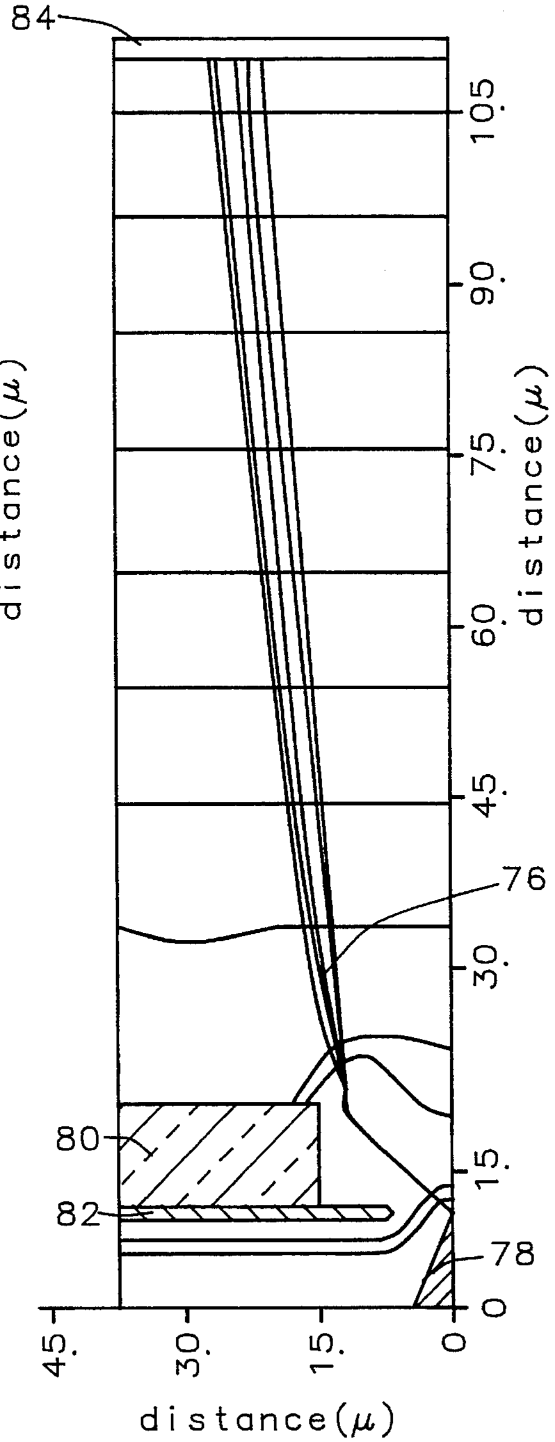

The effects of this voltage cycle can be seen with reference to FIGS. 14 and 15. The structural elements shown in these figures include microtip 78, dielectric 80 and gate 82, as formed by either of the two methods discussed above. When the brief, charging voltage 72 is applied, electron stream 77 is emitted from microtip 78 and primarily impacts on the sidewall of dielectric 80. This causes a charge to accumulate on the sidewall, since at the higher charging voltage the emitted electrons have a larger deflection angle from the microtip. During the lower, operational voltage part of the cycle, the electron stream 76 in FIG. 15 is deflected by the charge at the dielectric sidewall and proceeds upward to the anode 84.

Figure 16:
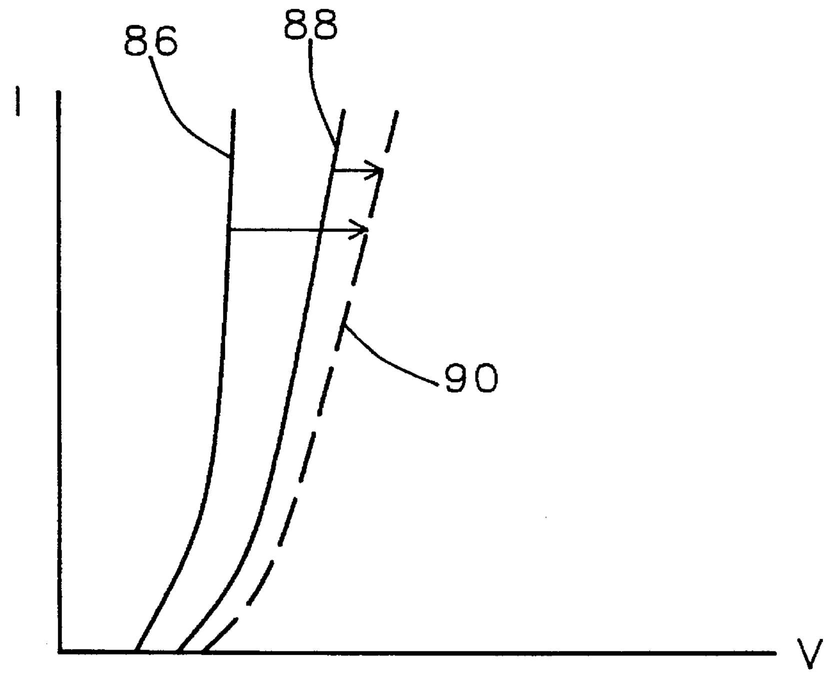
FIG. 16 is a graphical depiction of the current characteristics of non-uniform microtips, and of the highly uniform microtip of the invention.

The effect the sidewall charging has on non-uniform microtips is now described. As shown in FIG. 16, two microtips with different tip radii and gate openings would have two different current characteristic curves, tip 1 having curve 86 indicating its current $I_1$, and tip 2 having curve 88 with current $I_2$. At a given voltage, $$I_1>I_2$$

The charge magnitudes Q are proportional to the currents, so that $$Q_1>Q_2$$

The charge magnitude Q can reduce the electric field E near the gate opening and microtip, this field E being produced by the voltage applied on the gate during normal operation. The magnitude of the reduced E field, ΔE, is proportional to the charge magnitude Q, thus $$\Delta E_1>\Delta E_2$$

The field emission current during normal operation will be affected by and proportional to the electric field E near the microtip. Thus the reduction of the emission current (ΔI) is $$\Delta I_1>\Delta I_2$$

The final emission current is equal to I–ΔI, This leads to a compensation effect and results in a new characteristic curve 90 shown in FIG. 16, in which both tips have the same characteristics under this self-compensating operation. Although the final I–V characteristic curve 90 still has higher operating voltage than the original curve 88 or 89, this voltage difference is much smaller than the prior art $V_c$–$V_c$' shown in FIG. 2.

Since, unlike the prior art, there is no resistor in the current path of the invention, the display size is not limited by the additional power dissipation a resistor would cause.

While the invention has been particularly shown and described with reference to the preferred embodiments thereof, it will be understood by those skilled in the art that various changes in form and details may be made without departing from the spirit and scope of the invention.

What is claimed is:

1. A method of fabricating microtips for a field emission display, on a substrate, comprising:

forming a first conductive layer on said substrate to act as a cathode;

forming a first dielectric layer over said first conductive layer;

forming a second conductive layer over said first dielectric layer to act as a gate;

forming a second dielectric layer over said second conductive layer;

patterning said second dielectric layer to provide an opening to said second conductive layer;

forming a thin insulating layer over said second dielectric layer and said second conductive layer;

patterning said thin insulating layer and said second conductive layer to form a narrower opening than said opening in said second dielectric layer;

removing said first dielectric layer in the region defined by said narrower opening, and also a portion of said first dielectric layer under said second conductive layer and adjacent to said narrower opening; and forming said microtips on the exposed surface of said first conductive layer.

2. The method of claim 1 wherein said opening in said second dielectric layer has a diameter of between about 2 and 4 micrometers, and said narrower opening has a diameter of between about 0.8 and 1.2 micrometers.

3. The method of claim 1 wherein said first conductive layer has a thickness of between about 2000 and 5000 Angstroms.

4. The method of claim 1 wherein said second conductive layer has a thickness of between about 2000 and 5000 Angstroms.

5. The method of claim 1 wherein said second dielectric layer has a thickness of between about 5000 and 10,000 Angstroms.

6. A method of fabricating microtips for a field emission display, on a substrate, comprising:

forming a first conductive layer on said substrate to act as a cathode;

forming a first dielectric layer over said first conductive layer;

forming a second conductive layer over said first dielectric layer to act as a gate;

forming a second dielectric layer over said second conductive layer;

forming a thin insulating layer over said second dielectric layer;

patterning said thin insulating layer, said second dielectric layer and said second conductive layer to form a narrow opening;

removing a portion of said first dielectric layer under said opening in said second conductive layer, and also under said second conductive layer and adjacent to said narrow opening in said second conductive layer, and a portion of said second dielectric layer to form a wide opening;

removing said thin insulating layer; and forming said microtips on the exposed surface of said first conductive layer.

7. The method of claim 6 wherein said removing a portion of said first dielectric layer and a portion of said second dielectric layer to form a wide opening is accomplished with a wet etch.

8. The method of claim 6 wherein said wide opening has a diameter of between about 2 and 4 micrometers, and said narrow opening has a diameter of between about 0.8 and 1.2 micrometers, and has the same center point as said wide opening.

9. The method of claim 6 wherein said first conductive layer has a thickness of between about 2000 and 5000 Angstroms.

10. The method of claim 6 wherein said second conductive layer has a thickness of between about 2000 and 5000 Angstroms.

11. The method of claim 6 wherein said second dielectric layer has a thickness of between about 5000 and 10,000 Angstroms.

* * * * *